United States Patent [19]

Matsunaga et al.

[11] Patent Number: 5,097,171
[45] Date of Patent: Mar. 17, 1992

[54] PIEZO-ACTUATOR SHOCK ABSORBER DAMPING FORCE CONTROLLING SYSTEM HAVING ABNORMALITY DETECTION FUNCTION

[75] Inventors: Eiju Matsunaga, Kariya; Yutaka Suzuki, Nishio; Makoto Shiozaki, Kariya; Toshinobu Ishida, Okazaki, all of Japan

[73] Assignees: Nippondenso Co., Ltd., Kariya; Nippon Soken, Inc., Nishio, both of Japan

[21] Appl. No.: 425,716

[22] Filed: Oct. 24, 1989

[51] Int. Cl.⁵ .......................................... H01L 41/08
[52] U.S. Cl. .................................... 310/316; 310/317; 310/328
[58] Field of Search ................. 310/316, 317, 323, 328

[56] References Cited

U.S PATENT DOCUMENTS

| | | | |
|---|---|---|---|
| 3,573,781 | 4/1971 | Shah | 310/317 X |
| 3,819,961 | 6/1974 | Bourgeois et al. | 310/316 |
| 3,828,773 | 8/1974 | Buch et al. | 310/317 X |
| 3,989,042 | 11/1976 | Mitsui et al. | 310/316 X |
| 4,593,658 | 6/1986 | Moloney | 310/316 X |
| 4,729,459 | 3/1988 | Inagaki et al. | 188/289 |
| 4,888,514 | 12/1989 | Takahashi et al. | 310/316 |
| 4,901,034 | 2/1990 | Frank-Peter | 310/316 X |
| 5,013,955 | 5/1991 | Hara et al. | 310/328 X |

Primary Examiner—Mark O. Budd
Attorney, Agent, or Firm—Cushman, Darby & Cushman

[57] ABSTRACT

A shock absorber system for controlling the damping forces of shock absorbers comprising a drive apparatus for operating a piezo-actuator which is constructed by laminating a plurality of piezoelectric elements. The drive apparatus comprises a high-voltage generation circuit for generating a high voltage and a charging and discharging circuit for applying the high voltage, generated by the high-voltage generation circuit, to the piezo-actuator and for discharging an electric charge charged in the piezo-actuator due to the application of the high voltage thereto, the charging and discharging results in expansion and contraction of the piezo-actuator. Also included in the drive apparatus is an abnormality detection circuit for detecting a charging current or a discharging current passing through a charging or discharging current passage coupled to the piezo-actuator at the time of charging or discharging by the charging and discharging circuit. The abnormality detection circuit determines an abnormality of the drive apparatus when the detected charging current or discharging current is below a predetermined value.

21 Claims, 8 Drawing Sheets

PIEZO-ACTUATOR SHOCK ABSORBER DAMPING FORCE CONTROLLING SYSTEM HAVING ABNORMALITY DETECTION FUNCTION

BACKGROUND OF THE INVENTION

The present invention relates generally to a system for controlling the damping forces of shock absorbers, comprising a piezo-actuator including a piezoelectric device made up by laminating piezoelectric elements, and more particularly to such a system having an abnormality detection function.

Various types of variable damping force type shock absorbers for use in motor vehicles, for example, have been developed heretofore with a view to allowing damping force switching control with high response. One approach involves using, for the variable damping force type shock absorber, a piezo-actuator comprising a laminated piezoelectric device made up by laminating a plurality of piezoelectric elements, as disclosed in Japanese Patent Provisional Publication No. 61-85210. Generally, when driving such a piezo-actuator to control the damping force of the shock absorber, the piezo-actuator requires a high voltage (for example, several hundreds of volts), and therefore an important aspect arising in use of such a piezo-actuator relates to the need for the drive apparatus which has high reliability on application of the high voltage thereto. Occurrence of abnormalities such as trouble of the inside parts of the drive apparatus and disconnection or short between the drive apparatus and the piezo-actuator causes difficulty in meeting the requirements to adequately control the damping force of the shock absorber.

SUMMARY OF THE INVENTION

It is therefore an object of the present invention to provide a shock absorber system for controlling the damping force of shock absorbers, comprising piezo-actuator drive apparatus which is capable of quickly detecting abnormality to prevent possible operation troubles of the piezo-actuator.

A drive apparatus of this invention is arranged to operate a piezo-actuator which is constructed by laminating a plurality of piezoelectric elements, and comprises a high-voltage generation circuit for generating a high voltage and a charging and discharging circuit for applying the high voltage, generated by the high-voltage generation circuit, to the piezo-actuator and for discharging an electric charge charged in the piezo-actuator due to the application of the high voltage thereto, the charging and discharging results in expansion and contraction of the piezo-actuator. Also included in the drive apparatus is an abnormality detection circuit for detecting a charging current or a discharging current passing through a charging or discharging current passage coupled to the piezo-actuator at the time of charging or discharging by the charging and discharging circuit. The abnormality detection circuit determines an abnormality of the drive apparatus when the detected charging current or discharging current is below a predetermined value. Furthermore, in response to the detection of the abnormality of the drive apparatus, the operation of the high-voltage circuit is inhibited when an abnormality indication is made, thereby improving the reliability of the drive apparatus.

Moreover, the drive apparatus of this invention can include an abnormality detection which detects a charging current or a discharging current passing through a charging or discharging current passage coupled to the piezo-actuator at the time of charging or discharging by the charging and discharging circuit and which compares the detected charging or discharging current with a predetermined value to generate a predetermined level signal for determination of an abnormality of the drive apparatus while the detected charging current or discharging current exceeds the predetermined value.

The abnormality detection circuit detects the charging current or discharging current by means of a detection resistor which is disposed in said charging or discharging current passage. In addition, at least one of the charging and discharging current passages has therein another resistor whereby the time constant of the charging or discharging becomes equal to a predetermined time constant.

Preferably, the drive apparatus further comprises means responsive to the predetermined level signal for determining the abnormality of the drive apparatus to inhibit the boosting operation of the high-voltage generation circuit in accordance with the determination of the abnormality detection circuit. The inhibiting means determines the abnormality of the drive apparatus on the basis of a continuous generation time of the predetermined level signal, that is, when the continuous generation time is shorter than a first predetermined time or when greater than a second predetermined time.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
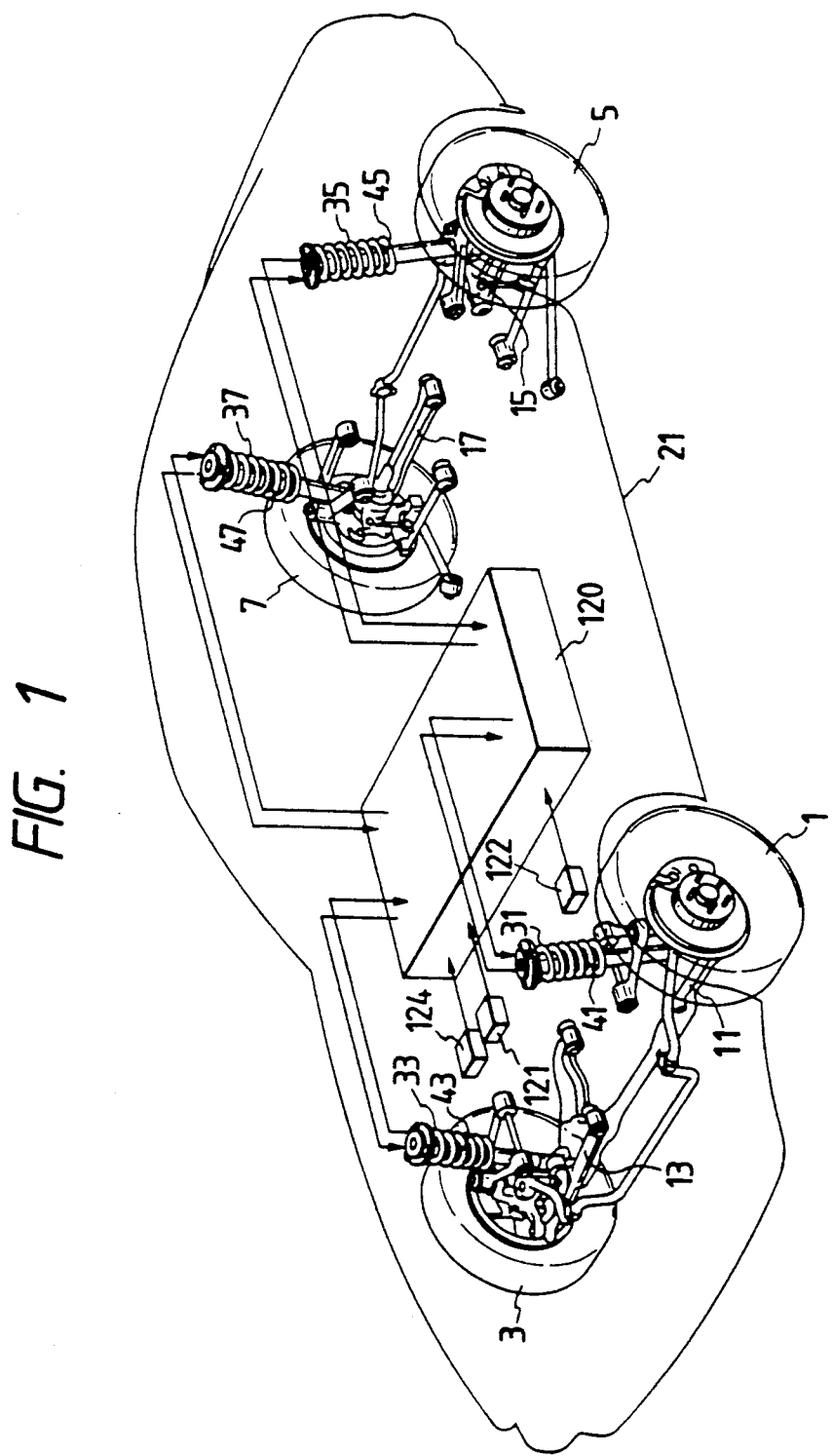
FIG. 1 illustrates a system for operating a piezo-actuator of each of variable damping force type shock absorbers which are incorporated in a motor vehicle.
Figure 2:
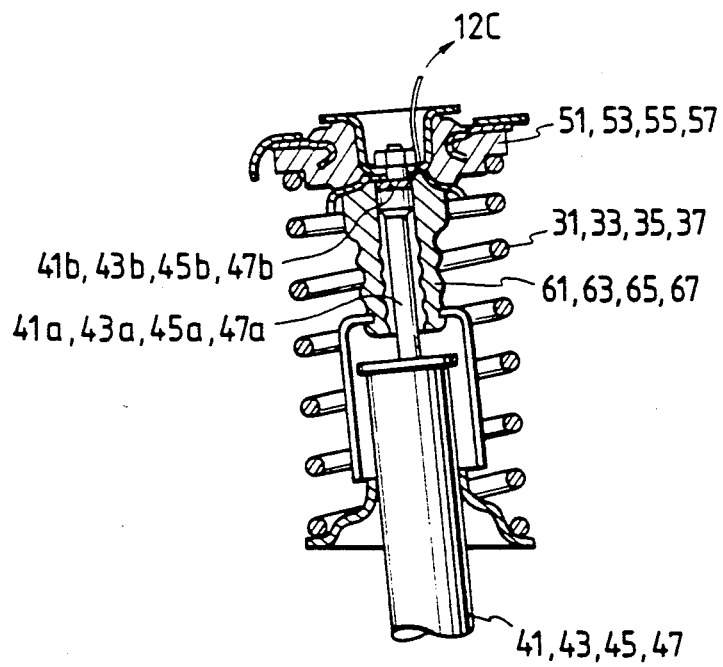
FIG. 2 is a cross-sectional view showing the shock absorber including a piezoelectric load sensor.

Referring now to FIG. 1, there is schematically illustrated an shock absorber control system for a motor vehicle which includes a piezo-actuator drive apparatus according to an embodiment of the present invention. In FIG. 1, suspension assemblies comprising coil springs 31, 33, 35, 37 and variable damping force type shock absorbers 41, 43, 45, 47 are respectively disposed between a body 21 of the vehicle and suspension arms 11, 13, 15, 17 for front and rear wheels 1, 3, 5, 7. As illustrated in FIG. 2, at upper portions of the shock absorbers 41, 43, 45, 47 are provided suspension upper supports 51, 53, 55, 57 which are subjected to loads generated between the shock absorbers 41, 43, 45, 47, the coil springs 31, 33, 35, 37, bound stoppers 61, 63, 65, 67, and the vehicle body 21.

Figure 3:
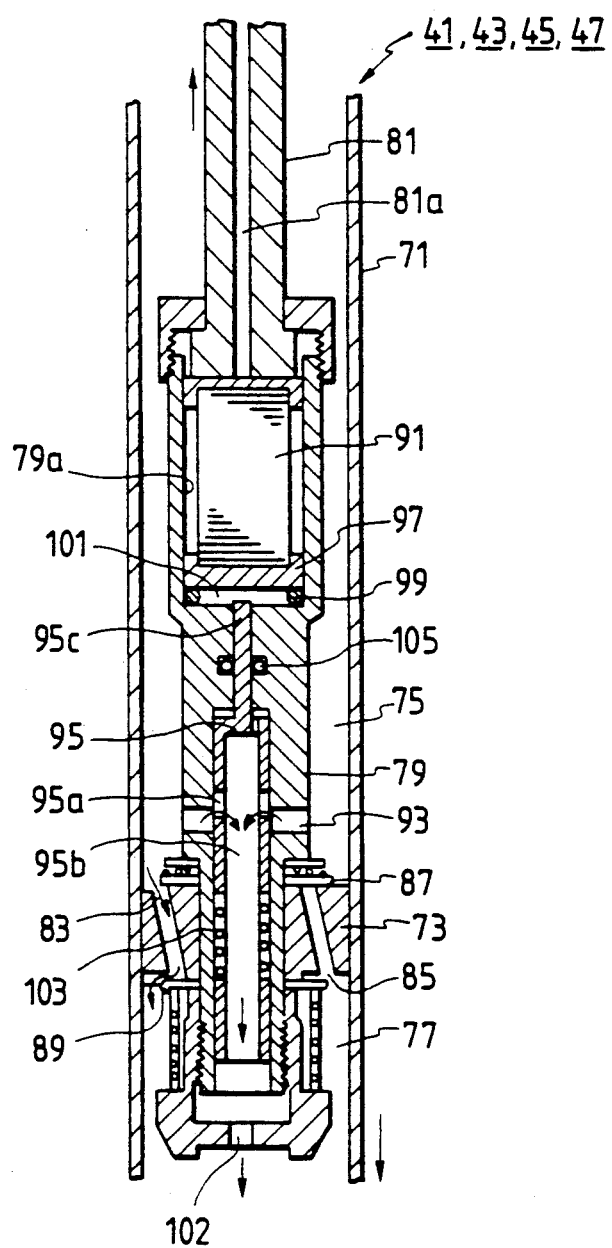
FIG. 3 is a partially cross-sectional view of the variable damping force type shock absorber including the piezo-actuator.

The transfers of the loads between the shock absorbers 41, 43, 45, 47 and the vehicle body 21 are effected through shafts 41a, 43a, 45a, 47a. Between the shafts 41a, 43a, 45a, 47a and the suspension upper supports 51, 53, 55, 57 are placed piezoelectric load sensors 41b, 43b, 45b, 47b each comprising a piezoelectric ceramics such as so-called PZT. Thus the loads applied to the shock absorbers 41, 43, 45, 47 are respectively detectable on the basis of the outputs of the piezoelectric load sensors 41b, 43b, 45b, 47b. Furthermore, each of the shock absorbers 41 to 47 is arranged so that its damping force is variable. That is, as shown in FIG. 3, each of the shock absorbers 41 to 47 has a cylinder 71 in which an absorber piston 73 is disposed so as to be slidable in the directions of its axis. The piston 73 divides the inside of the cylinder 71 into a first hydraulic pressure chamber 75 and a second hydraulic pressure chamber 77. This piston 73 is connected to one end portion of a piston rod 79. The other end portion of the piston rod 79 is fixedly secured to one end of a shaft 81 and the other end portion of the shaft 81 is protruded upwardly from the upper end of the cylinder 71.

Figure 4:
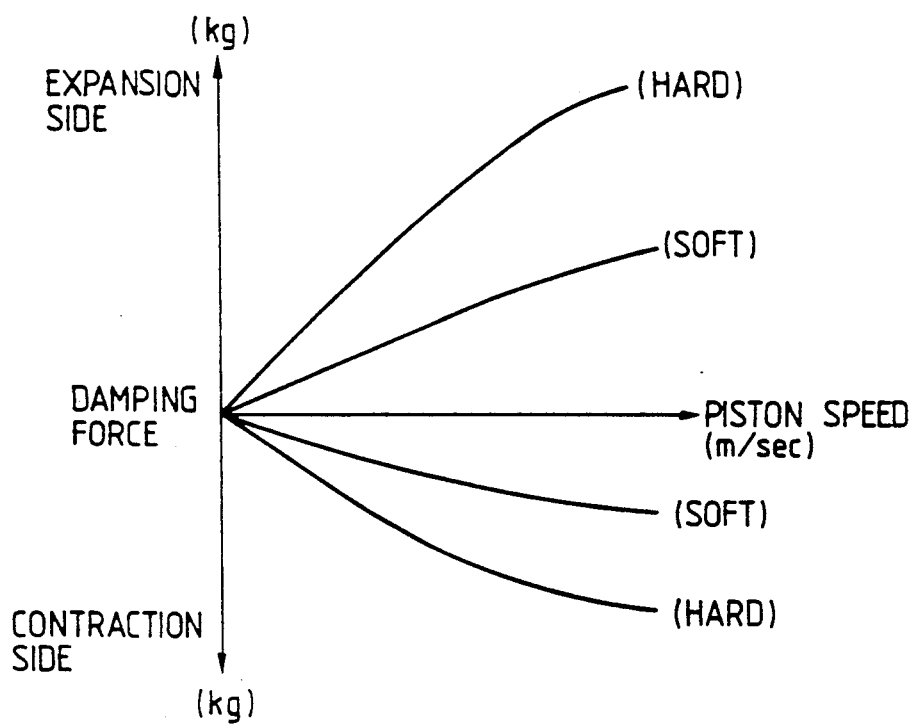
FIG. 4 is a graphic diagram showing the relation between the damping force and the speed of a piston of the shock absorber.

The piston 73 has therein an extension side fixed orifice 83 and a contraction side fixed orifice 85 which establish the communication between the first and second hydraulic pressure chambers 75 and 77 and which are respectively engaged with valves 87 and 89 for determining its flowing directions. Thus, when the piston 73 moves upwardly and downwardly with respect to the cylinder 71, the pressurized oils in the first and second hydraulic pressure chambers 75, 77 are alternately moved through the fixed orifices 83 and 85 thereinto. Accordingly, the shock absorber shows high-damping force (Hard) characteristic, as illustrated in FIG. 4.

The piston rod 79 has therein a piezo-actuator 91 constructed by laminating a plurality of piezoelectric elements and a center rod 95 which makes up a variable orifice 93. This piezo-actuator 91 is placed in a cylindrical space or hole 79a formed in the piston rod 79, and a piston 97 is provided on the lower surface thereof. The piston 97 is slidable in the directions of the axis of the piston rod 79 and is moved downwardly by several times of ten micrometers in the figure in response to application of a voltage of several hundreds volts to the piezo-actuator 91. When stopping the application of the voltage to the piezo-actuator 91, the piezo-actuator 91 is contracted so as to take the original length. Here, the application of the voltage to the piezo-actuator 91 is performed through a lead wire, not shown, which is disposed in an elongated hole 81a formed in the shaft 81 to extend along the axis of the shaft 81. The lower end surface of the piston 97 is pressed against an O-ring 99 which in turn seals the oil within a pump chamber 101 and which is transformed in response to the movement of the piston 97.

In a hole of the piston rod 79 formed along the directions of the axis of the piston rod 79 is disposed the center rod 95 for adjusting the cross-sectional area of the flow passage of the variable orifice 93, the center rod 95 being slidably inserted thereinto so as to make up the variable orifice 93. The center rod 95 has holes 95a and 95b formed in the directions of the axis and diameter thereof. In response to downward movement of the center rod 95, the cross-sectional area of the flow passage of the variable orifice 93 is enlarged, whereby the flow rate of oil from the first hydraulic pressure chamber 75 through the passages 93, 95a, 95b and a passage 102 to the second hydraulic pressure chamber 77 is increased. As a result, the shock absorber shows a low damping force (SOFT) characteristic as illustrated in FIG. 4. On the other hand, when the center rod 95 is moved upwardly, the cross-sectional area of the flow passage is decreased. The center rod 95 is biased upwardly by means of a spring 103 so that the passage ordinally assumes the small cross-sectional area.

The center rod 95 has at its upper portion a small rod portion 95c whose diameter is decreased relatively, the upper portion of the small rod portion 95c extending up to the oil-tight chamber 101. An O-ring 105 is provided in order to effect the seal between the oil-tight chamber 101 and the second hydraulic pressure chamber 77. That is, when the piezo-actuator 91 expands in response to application of the voltage, the oil within the oil-tight chamber 101 moves the center rod 95 downwardly with a stroke proportional to the ratio of the cross-sectional area of the piston 97 to the cross-sectional area of the small rod portion 95c, thereby increasing the cross-sectional area of the passage.

The output signals of the piezoelectric load sensors 41b, 43b, 45b, 47b, as illustrated in FIG. 1, are respectively input in an electronic control unit 120. The electronic control unit 120 also receives the output signals of a steering sensor 121, a vehicle speed sensor 122, a brake switch 124 and others. In response to these signals, the electronic control unit 120 adjusts the voltage application to the piezo-actuators 91 of the shock absorbers 41, 43, 45, 47 so as to control the damping forces of the shock absorbers 41, 43, 45 and 47.

Figure 5:
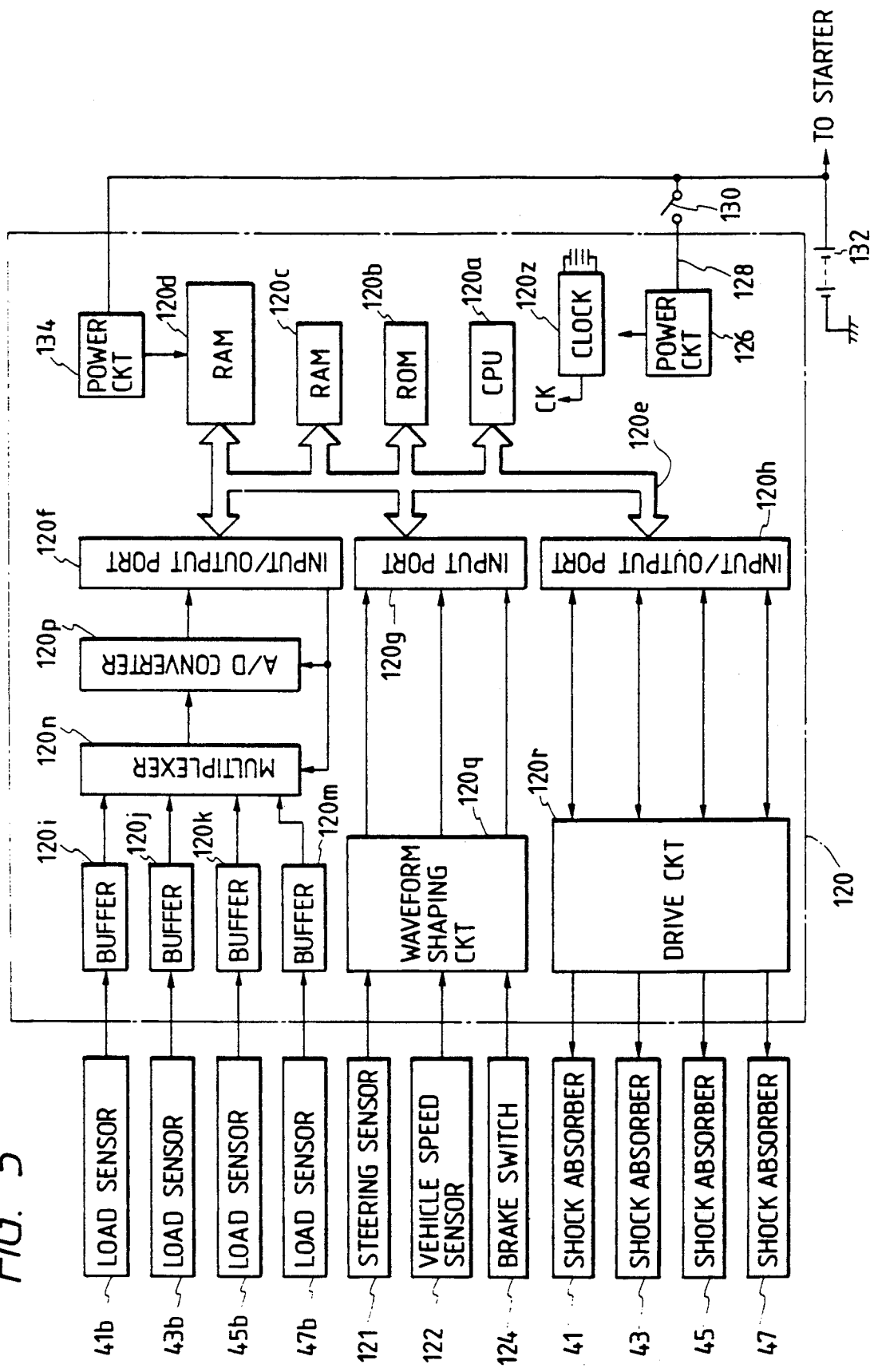
FIG. 5 is a block diagram showing an arrangement of an electronic control unit used for controlling the shock absorber.

FIG. 5 is a block diagram showing an arrangement of the electronic control unit 120. In FIG. 5, the electronic control unit 120 is constructed as a logical operation circuit comprising a central processing unit (CPU) 120a, a read-only memory (ROM) 120b, a random access memory (RAM) 120c, a back-up random access memory (back-up RAM) 120d and others which are coupled through a common bus 120e to an input/output port 120f, an input port 120g and input/output port 120h. The detection signals of the piezoelectric load sensors 41b, 43b, 45b and 47b are supplied to buffers 120i, 120j, 120k and 120m, the outputs of which are led through a multiplexer 120n, and an analog-to-digital (A/D) converter 120p and the input/output port 120f to the CPU 120a. Further, the output signals of the steering sensor 121, the vehicle speed sensor 122, the brake switch 124 and others are supplied to a waveform shaping circuit 120q, the outputs of which are respectively supplied through the input port 120g to the CPU 120a. In addition, the control of the voltage application to the piezo-actuators 91 of the shock absorbers 41, 43, 45, 47 is performed in accordance with control signals which are supplied from the CPU 120a through the input/output port 120h to a drive circuit 120r.

A power circuit 126 is coupled to a power-supplying line 128 which is in turn coupled through a key switch 130 to a battery 132. Further, the back-up RAM 120d is arranged to receive power from another power circuit 134 for maintaining storage even if power is not supplied to the electronic control unit 120 due to turning-off of the key switch 130.

The electronic control unit with the above-described arrangement sets the upper and lower limits of the damping force variation (rate-of-change) for each of the shock absorbers 41, 43, 45, 47 in accordance with the driving state of the motor vehicle to be detected by the steering sensor 121, the vehicle speed sensor 122, the brake switch 124 and others. Further, the electronic control unit 120 calculates the damping force variation of the respective shock absorbers 41, 43, 45, 47 on the basis of the detection signals of the respective piezoelectric load sensors 41b, 43b, 45b, 47b and switches the damping forces of the respective shock absorbers 41, 43, 45, 47 so as to be small when the calculated damping force variation is not between the set upper and lower limits. That is, when the damping force variation is not between the upper and lower limits, the electronic control unit 120 determines the fact that the running road surface is irregular. In this state, the damping force of the shock absorber is set to be small, whereby the vehicle vibration due to road irregularity is prevented to improve the comfortable ride of the motor vehicle.

Moreover, as will be described hereinafter, in this embodiment, the drive circuit 120r for switching the damping forces of the respective shock absorbers 41, 43, 45, 47 by driving the piezo-actuators 91 thereof has a self-checking function and is arranged to be deenergized in accordance with a command signal from the external. During execution of the damping force switching control, the operation of the drive circuit 120r is stopped in response to generation of an abnormality-detection signal by the drive circuit 120r.

Figure 6A:
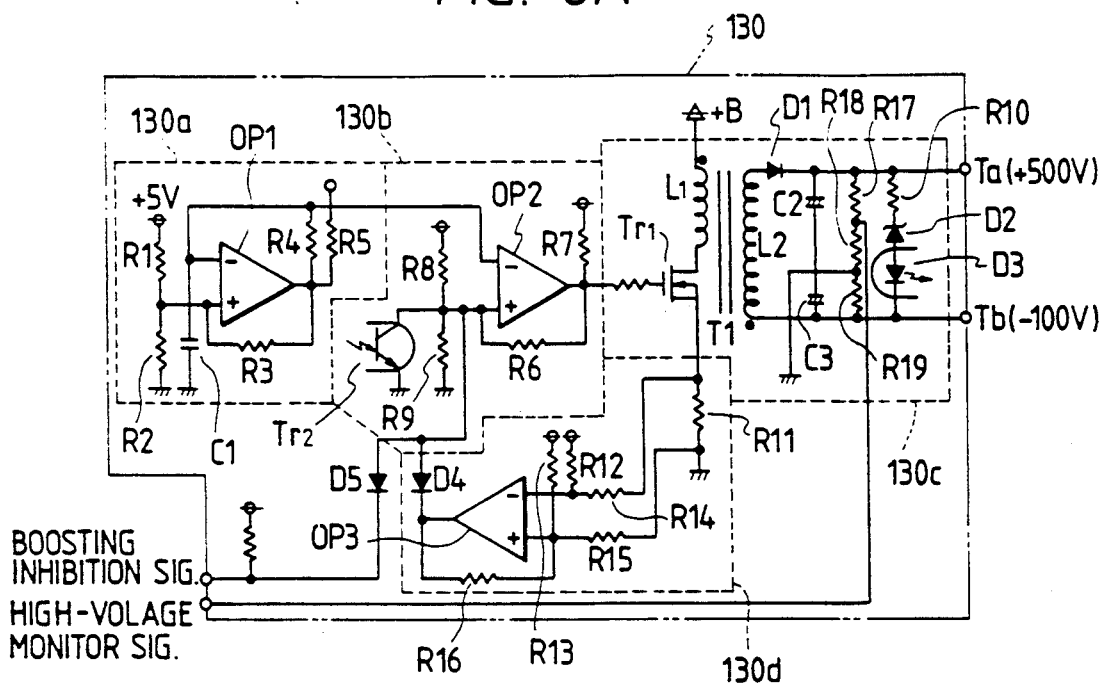
FIG. 6A and 6B are circuit diagrams showing an arrangement of a drive circuit for the piezo-actuator.
Figure 6B:
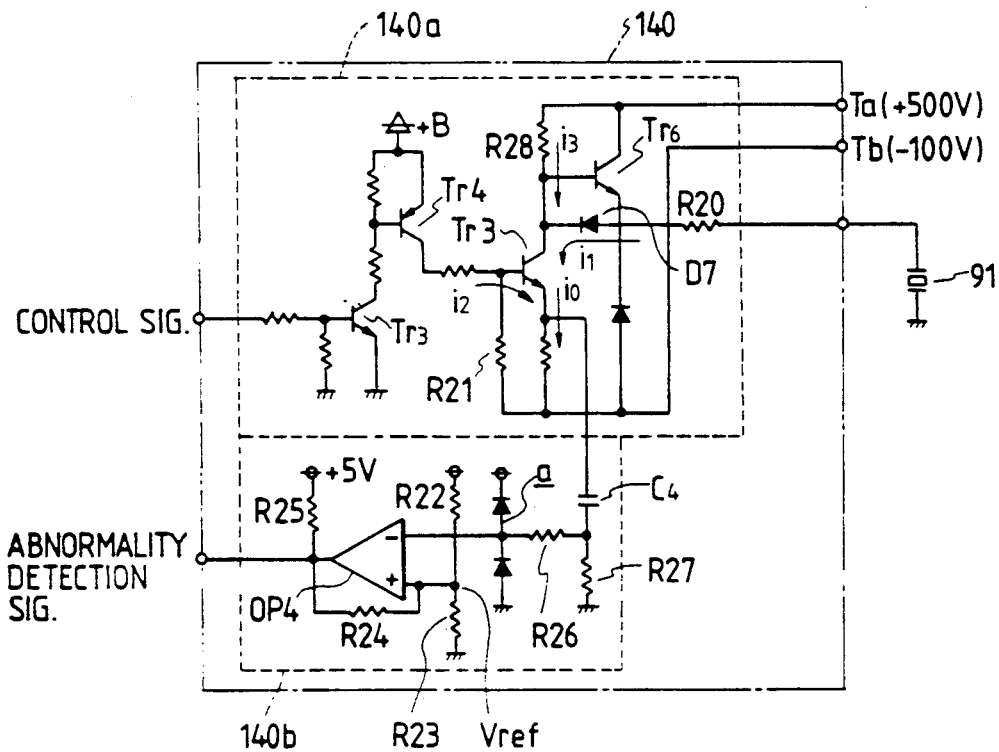

FIGS. 6A and 6B are circuit diagrams showing an arrangement of the drive circuit 120r. In FIGS. 6A and 6B, the drive circuit 120r includes a high-voltage generation circuit 130 for generating a high voltage to drive the piezo-actuators 91 of the respective shock absorbers 41, 43, 45, 47. Also included in the drive circuit 120r are four charging and discharging circuits 140 each, in according with a control signal outputted from the CPU 120a at every shock absorber 41, 43, 45 or 47, applying the high voltage from the high-voltage generation circuit 130 to the piezo-actuator 91 of each of the respective shock absorbers 41 through 47 so as to expand the piezo-actuator 91 and further discharging the electric charge charged in the piezo-actuator 91 due to the application of the high voltage so as to contract the piezo-actuator 91. The high-voltage generation circuit 130, as illustrated in 6A, comprises a triangular wave generation circuit 130a, a pulse-width modulation circuit 130b, a booster circuit 130c and an over-current detection circuit 130d.

The triangular wave generation circuit 130a is constructed as a switching regulator comprising an operational amplifier OP1, a capacitor C1 and resistors R1 to R5 and generates a triangular wave, whose frequency is above the audio frequency (about 25 to 40 kHz) and whose voltage varies between 2V and 3V, in response to charging and discharging to and from the capacitor C1. The triangular wave generated by the triangular wave generation circuit 130a is inputted in the pulse-width modulation circuit 130b where it is compared in a comparator comprising an operational amplifier OP2 and resistors R6, R7 with a reference voltage obtained by the voltage-division caused by resistors R8 and R9.

The pulse-width modulation circuit 130b outputs a high-level pulse signal when the output signal of the triangular wave generation circuit 130a is lower than the reference voltage, whereby a transistor Tr1 in the booster circuit 130c is turned on and off.

In the booster circuit 130c, in response to the turning-on of the transistor Tr1, current flows through the primary coil L1 of a boosting transformer T1, and when the transistor Tr1 is switched from ON to OFF, capacitors C2 and C3 are charged by the counter electromotive force produced in the secondary coil L2 thereof. Further, in this embodiment, in order to the high-voltage terminal of the secondary coil L2 being set to +500V and the low-voltage terminal being set to −100V, the junction between the capacitors C2 and C3 are grounded, and a Zener diode D2 for maintaining the voltage across the secondary coil L2 to 600V is, together with a resistor R10 and a light emitting diode D3, provided in parallel to the capacitors C2 and C3. Thus, in the booster circuit 130c, when the voltage becomes above 600V, current flows through the resistor R10 and the Zener diode D2 into the light emitting diode D3 which in turn generates light in correspondance with the current amount.

The light emitted from the light emitting diode D3 reaches a phototransistor Tr2 of the pulse-width modulation circuit 130b. The phototransistor Tr2 is coupled to a reference voltage input terminal (in this embodiment, non-inversion input terminal) of the operational amplifiler OP2, making up the comparator, so as to lower the reference voltage in correspondance with the light emitting amount of the light emitting diode D3. Thus, in the case that the output voltage of the booster circuit 130c exceeds 600V, the width of the pulse output from the pulse-width modulation circuit 130b is shortened so as to control the boosting operation of the booster circuit 130c.

The over-current detection circuit 130d comprises a current detection resistor R11 provided in a current-flowing passage of the transistor Tr1 and a comparator including an operational amplifier OP3 and resistors R12 to R16 to check whether the voltage across the resistor R11 becomes over a predetermined value. The over-current detection circuit 130d, in response to turning-on of the transistor Tr1, checks whether the amount of current flowing through the primary coil L1 of the boosting transformer T1 into the transistor Tr1 becomes over a predetermined level. If so, the reference voltage input terminal of the operational amplifier OP2 in the pulse-width modulation circuit 130b is grounded through a diode D4 to inhibit the boosting operation of the booster circuit 130b. Thus, in this embodiment, flow of an over-current to the transistor Tr1 is prevented by the over-current detection circuit 130d, thereby protecting the transistor Tr1.

Here, in this embodiment, in the booster circuit 130d, a load resistance made up of resistors R17 to R19 is coupled to the capacitors C2 and C3, and the boosted voltage is divided by these resistors and is monitored at the CPU 120a side. Further, the reference voltage input terminal of the operational amplifier OP2 of the pulse-width modulation circuit 130b is coupled through a diode D5 to the input/output port 120h, and a low-level boosting-inhibition signal is output from the CPU 120a side whereby the reference voltage input terminal is grounded so as to inhibit the boosting operation of the booster circuit 130c.

The charging and discharging circuit 140, as shown in FIG. 6B, includes a charging and discharging switching circuit 140a which, in accordance with a control signal from the CPU 120a, charges the piezo-actuator 91 by connection between the high-voltage terminal (+500V) of the high-voltage generation circuit 130 and the piezo-actuator 91 and further discharges the electric charge, charged in the piezo-actuator 91, by connection between the low-voltage terminal (−100V) of the high-voltage generation circuit 130 and the piezo-actuator 91. Also included in the charging and discharging circuit 140 is an abnormality detection circuit 140b which is arranged to detect the abnormality of the charging and discharging circuit 140 on the basis of the discharge current flowing at the time of discharging of the piezo-actuator 91.

Figure 7:
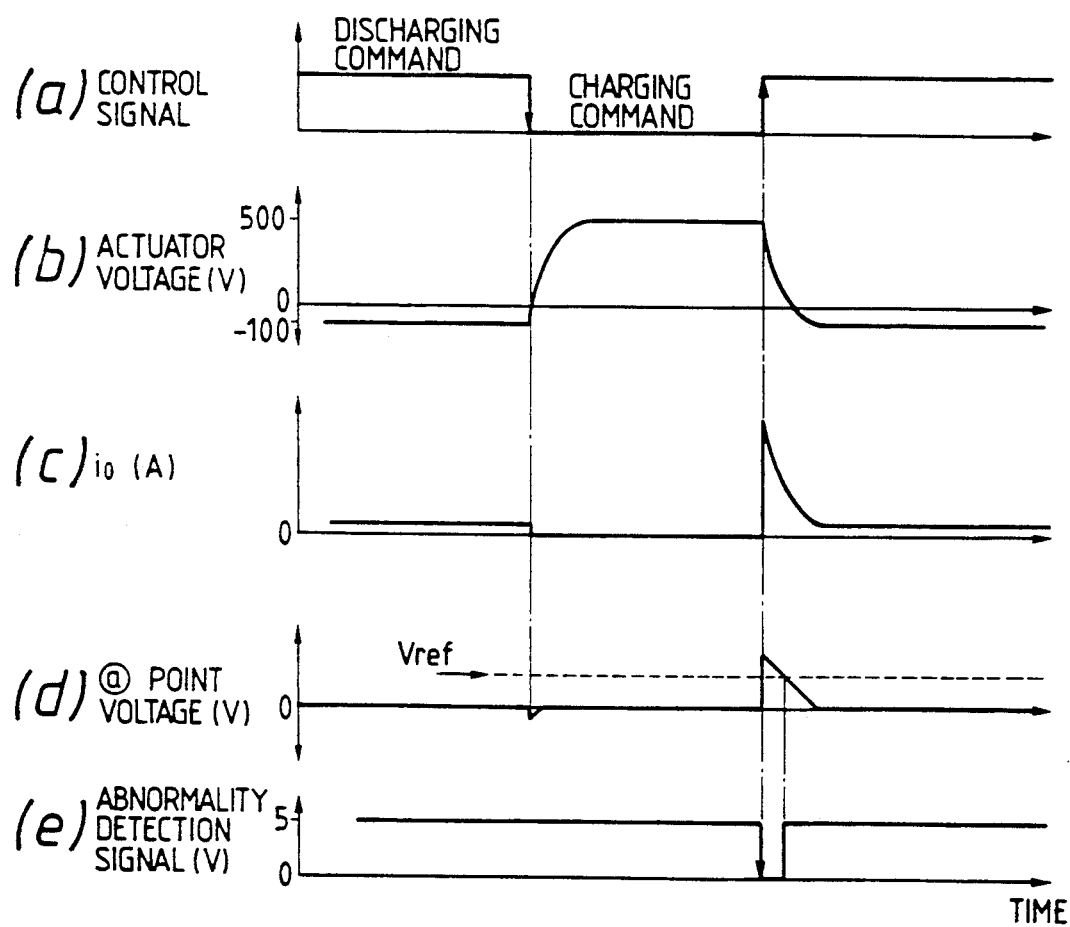
FIG. 7 is a time chart for describing the operation of the FIGS. 6A and 6B drive circuit.

In the charging and discharging switching circuit 140a, as shown in FIG. 7, when a low-level control signal (charging command signal) is outputted from the CPU 120a, transistors Tr3 and Tr4 which act as a buffer are respectively turned off so that a discharging switching transistor Tr5 enters into the OFF state, thereby resulting in turning on a charging switching transistor Tr6. Thus, a high-voltage terminal Ta of the high-voltage generation circuit 130 is coupled through the transistor Tr6 and a resistor R20 to the piezo-actuator 91, and therefore the charging is effected in accordance with the time-constant determined the capacitance of the piezo-actuator 91 and the resistance of the resistor R20 until the voltage of the piezo-actuator 91 becomes 500V, thereby resulting in expansion of the piezo-actuator 91. In this case, when the resistance value of the resistor R20 is set to a predetermined value and the charging and discharing speed is limited, it is possible to reduce the operating sound of the piezoelectric device.

On the other hand, in response to generation of a high-level control signal (discharge command signal) from the CPU 120a, the transistors Tr3 and Tr4 are respectively turned on so that the discharging switching transistor Tr5 enters into the ON state to set the charging switching transistor Tr6 into the OFF state. Thus, the low-voltage terminal Tb of the high-voltage generation circuit 130 is coupled through the transistor Tr5, the resistor R20, a diode D7 and a resistor R21 to the piezo-actuator 91 and the discharing is effected until the voltage of the piezo-actuator 91 becomes −100V, thereby resulting in the piezo-actuator 91 being contracted.

Furthermore, the abnormality detection circuit 140b comprises a capacitor C4 for extracting the alternating-current component of a current io which passes through the resistor R21 of the charging and discharging switching circuit 140a and a comparator including an operational amplifier OP4 and resistors R22 to R27 to check whether the level of the alternating-current component extracted by the capacitor C4 is above a reference voltage Vref. That is, in the case that the piezo-actuator 91 is charged, current does not flow through the resistor R21 of the charging and discharging switching circuit 140a, and in response to the discharging command when the control signal is switched to the low level, introduced thereto are the discharging current i1 from the piezo-actuator 91, the bias current i2 of the transistor Tr5, and current i3 flowing from the high-voltage generation circuit 130 through a resistor R28 and the transistor Tr5. Therefore, the current io (=i1+i2+i3) flowing into the resistor R21 of the charging and discharging switching circuit 140a becomes large at the time of start of the discharging of the piezo-actuator 91 as illustrated in (c) of FIG. 7.

Thus, the abnormality detection circuit 140b, as illustrated in (d) of FIG. 7, extracts the alternating-current component of the current io and checks whether the signal level (voltage at a point a in FIG. 6B) is above the reference voltage Vref. If it is above the reference voltage Vref, the circuit 140b outputs a low-level signal indicated by (e) of FIG. 7 whereby the CUP 120a side can detect the abnormality of the charging and discharging circuit 140 at the time of the start of the discharging on the basis of the outputted signal. That is, if the output signal of the abnormality detection circuit 140b is maintained to be in the high-level state at the time of start of the discharging, determination can be made such that the normal charging and discharging operation is not achieved due to troubles such as disconnection and short in the charging and discharging circuit 140, and the CPU 120a side can detect the abnormality of the charging an discharging circuit 140 on the basis of the abnormality detection signal outputted from the abnormality detection circuit 140a at the time of start of the discharging.

Figure 8:
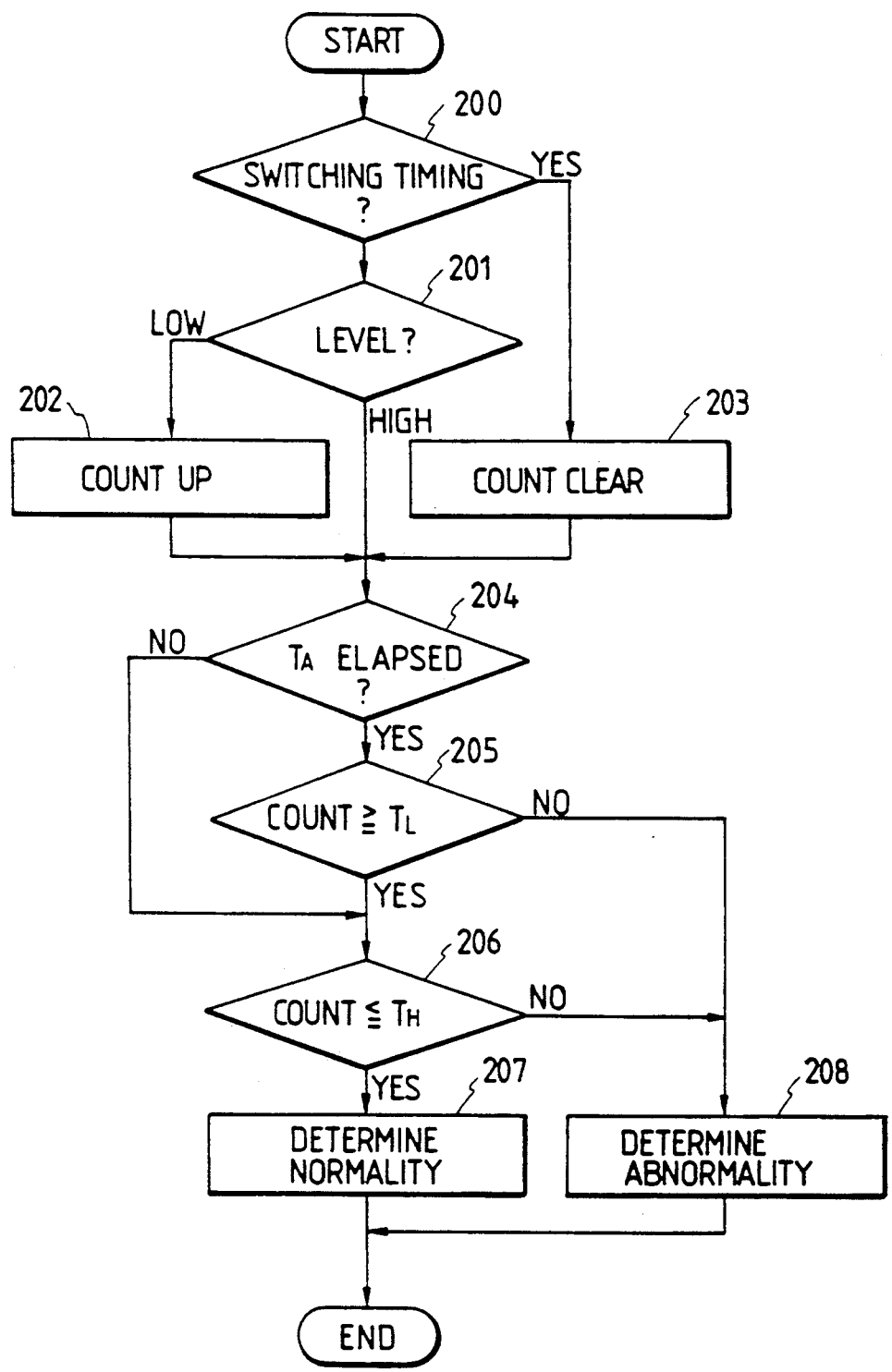
FIG. 8 is a flow chart for describing the operation executed by the drive apparatus of this invention.

FIG. 8 is a flow chart showing the abnormality determination process to be executed by the CPU 120a. This process starts with a step 200 to check the timing at which the damping force is required to be switched. In the case of the damping force switching timing, control goes to a step 203 to clear the count value indicating the continuous time period that the output signal of the abnormality detection circuit 140b is in the low level state. On the other hand, if not in the step 200, a step 201 is executed in order to check the level of the port in which the output signal of the abnormality detection circuit 140b is inputted. If being low level as shown in (e) of FIG. 7, a step 202 follows to increment the count value to count the continuous time period. A step 204 is provided to check whether a predetermined time $T_A$ is elapsed after the damping force switching. This is for the purpose of preventing error determination. If so, control advances to steps 205 and 206 to compare the count value with a first predetermined value $T_L$ (for example, 1 msec.) and a second predetermined value $T_H$ (for example, 0.5 sec.). When the count value is smaller than $T_L$ (occurrence of disconnection or short) and when the count value is greater than $T_H$ (occurrence of the trouble in which the terminals of the piezo-actuator 91 are conducted to each other with a high resistance), the determination of the abnormality is made in a step 208. In response to this determination of the abnormality, the CPU 120a inhibits the boosting operation of the high-voltage generation circuit 130. If the count value is greater than $T_L$ and smaller than $T_H$, the determination is made as normality in a step 207. If in the step 204 the answer is negative, control jumps to the above-described step 206.

As described above, in this embodiment, since in the drive circuit of the piezo-actuator the abnormality detection circuit is provided so as to detect the abnormality of the charging and discharging circuit on the basis of the discharging current of the piezo-actuator, it is possible to check at every discharging of the piezo-actuator whether the charging and discharging circuit is normally operated, thereby heightening the reliability of the driving system of the piezo-actuator. In addition, since this embodiment is made so as to monitor the high voltage generated by the high-voltage generation circuit, it is possible to further detect an undesirable operation of the high-voltage generation circuit. The further improves the reliability of the drive apparatus.

Here, in this embodiment the capacitor C4 for extracting the alternating-current component of the discharging current is used in order to detect the discharging current in the abnormality detection circuit 140b. This is due to the fact that the terminal voltage of the piezo-actuator 91 is discharged at the time of discharging until it becomes −100V and the detection voltage is varied from the positive value to the negative value in the case that the direct-current component is not cut by the capacitor C4. That is, the capacitor C4 causes the fact that the discharging current is detectable as a positive voltage signal. Thus, in the case of no use of a negative voltage for the driving of the piezo-actuator (for example, in the case that the piezo-actuator is driven with 0 to 500V), the terminal voltage of the resistor R21 may be directly detected irrespective of using the capacitor.

Figure 9:
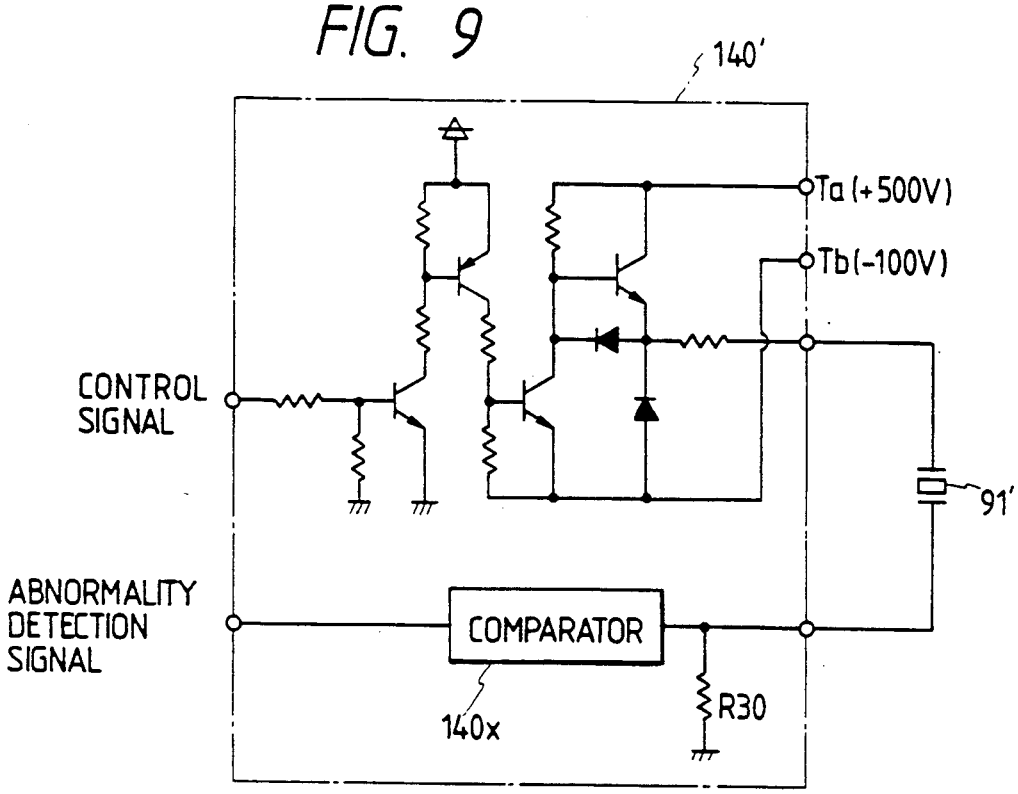
FIG. 9 shows another arrangement of the drive circuit for the piezo-actuator.

Furthermore, although in this embodiment the detection of the abnormality of the drive circuit is made by only the discharging current of the piezo-actuator 91, it is also appropriate that, as illustrated in FIG. 9, both terminals of a piezo-actuator 91' is built in a charging and discharging circuit 140' so that in the inside of the charging and discharging circuit 140' the grounding side terminal of the piezo-actuator 91' is grounded through a current detection resistor R30. In this case, both the discharging current and charging current of the piezo-actuator 91' are detectable on the basis of the voltage across both the terminals of the resistor R30; and with the detected charging current level and the discharging current level being respectively compared in a comparing circuit 140x with reference voltages, the abnormality of the drive circuit is detectable at the time of charging and discharging of the piezo-actuator 91'.

Figure 10:
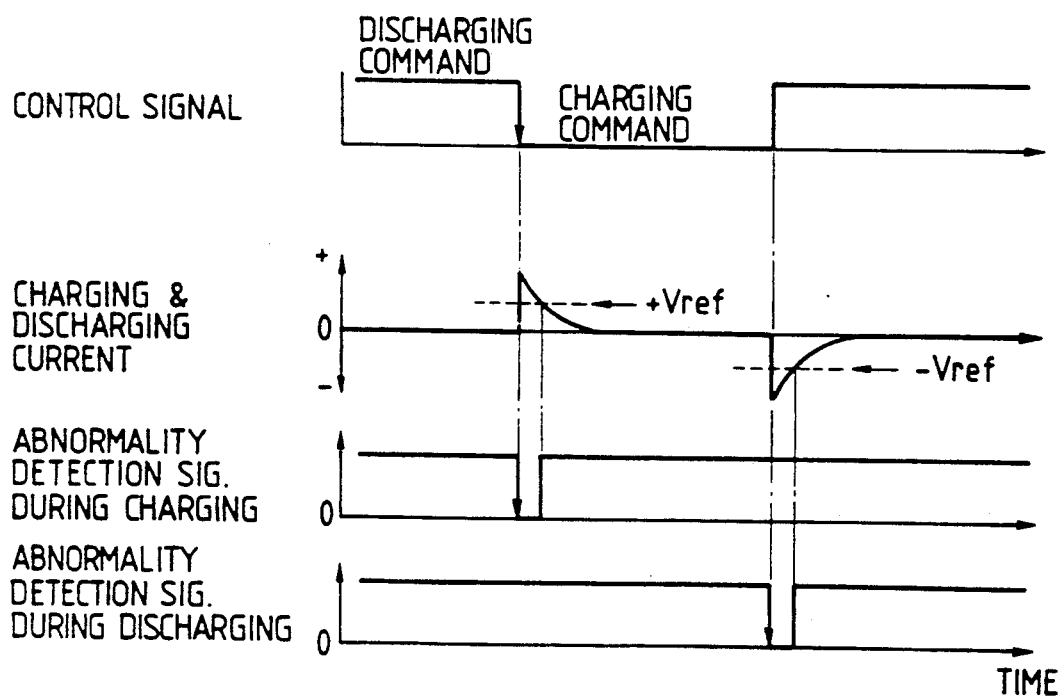
FIG. 10 is a timing chart for describing the operation of the FIG. 9 drive circuit.

That is, in the case that the charging and discharging circuit has the above-described arrangement, as illustrated in FIG. 10, a positive direction current flows toward the resistor R30 at the time of charging of the piezo-actuator 91' and on the other hand, a reverse direction current flows into the resistor R30 at the time of discharging thereof, and therefore, if the charging and discharging currents are detected by the voltage across both the terminals of the resistor R30 and the voltage levels are compared with reference voltages +Vref and −Vref, it is possible to obtain an abnormality detection signal which becomes low level at the time of start of the charging when the charging and discharging circuit is normal and obtain an abnormality detection signal which becomes low level at the time of start of the discharging when the charging and discharging circuit is in the normal state. On the basis of these abnormality detection signals, it is possible to detect the abnormality at the time of the charging and discharging of the piezo-actuator 91'.

It should be understood that the foregoing relates to only a preferred embodiment of the present invention, and that it is intended to cover all changes and modifications of the embodiment of the invention herein used for the purposes of the disclosure, which do not constitute departures from the spirit and scope of the invention.

What is claimed is:

1. A shock absorber system for controlling damping force of shock absorbers, said shock absorber system comprising:
   at least one shock absorber;
   a piezo-actuator disposed in said shock absorber, said piezo-actuator comprising a plurality of piezoelectric elements;
   drive means for operating said piezo-actuator, said drive means comprising:
   means for generating a high voltage;
   means for charging said piezo-actuator with said high voltage generated by said high-voltage generating means and for discharging said piezo-actuator, said charging and discharging resulting in expansion and contraction of said piezo-actuator; and
   abnormality detection means for detecting one of charging current and discharging current, passing through a changing/discharging current passage coupled to said piezo-actuator, when one of charging and discharging by said charging and discharging means occurs, and for determining an abnormality of said drive means when one of detected charging current and discharging current is below a predetermined value and providing a signal indicative of said abnormality.

2. A shock absorber system as in claim 1, wherein said abnormality detection means detects one of the charging current and discharging current with detection resistor means which is disposed in said changing/discharging current passage.

3. A shock absorber system as in claim 1, wherein said piezo-actuator controls the damping force of said shock absorber by expanding and contracting due to the charging and discharging.

4. A shock absorber system as in claim 1, wherein said charging/discharging current passage comprises resistor means for setting a time constant for the charging and discharging to a predetermined value.

5. A shock absorber system as in claim 1, said drive means further comprising means for inhibiting supply of the high voltage provided by said high-voltage generation means to said charging and discharging means in accordance with the signal provided by said abnormality detection means.

6. A shock absorber system for controlling damping force of shock absorbers, said shock absorber system comprising:
   at least one shock absorber;
   a piezo-actuator disposed in said shock absorber, said piezo-actuator comprising a plurality of piezoelectric elements,
   drive means for operating said piezo-actuator, said drive means comprising:
   means for generating a high voltage;
   means for charging said piezo-actuator with sad high voltage generated by said high-voltage generating means and for discharging said piezo-actuator, said charging and discharing resulting in expansion and contraction of said piezo-actuator; and
   abnormality detection means for detecting on of a charging current and discharing current, passing through a charging/discharging current passage coupled to said piezo-actuator, when one of charging and discharging by said charging and discharing means occurs, and for comparing the detected charging or discharing current with a predetermined value to generate a predetermined level signal indicative of an abnormality of said drive means when one of the detected charging current and discharging current exceeds said predetermined value.

7. A shock absorber system as in claim 6, wherein said abnormality detection means detect one of the charging current and discharging current in cooperation with detection resistor means disposed in said charging/discharging current passage.

8. A shock absorber system as in claim 6, wherein said piezo-actuator controls the damping force of said shock absorbers by expanding and contracting due to the charging and discharging.

9. A shock absorber system as in claim 6, wherein said charging/discharging current passage comprises resistor means for setting a time constant for the charging and discharging to a predetermined value.

10. A shock absorber system as in claim 6, said drive means further comprising means, responsive to said predetermined level signal provided by said abnormality detection means, for evaluating the abnormality of said drive means to inhibit supply of the high voltage provided by said high-voltage generation means to said charging and discharging means in accordance with the predetermined level signal provided by said abnormality detection means.

11. A shock absorber system as in claim 10, wherein said inhibiting means evaluates the abnormality of said drive apparatus on the basis of a continuous generation time of said predetermined level signal.

12. A shock absorber system as in claim 11, wherein said inhibiting means the evaluates abnormality of said drive apparatus when the continuous generation time of said predetermined level signal is one of shorter than a first predetermined time and greater than a second predetermined time.

13. A shock absorber system as in claim 1, wherein said drive mans further comprises control circuit means for generating a control signal to drive said charging and discharging means.

14. A shock absorber system as in claim 13 wherein said abnormality detection means detects the abnormality in accordance with generation of the control signal by said control circuit.

15. A shock absorber system as in claim 14, wherein said drive means further comprises means for limiting an amount of time allowed for said abnormality detecting means to detect the abnormality.

16. A shock absorber system as in claim 15, wherein said limiting means allows said abnormality detection means to perform abnormality detection until a predetermined time period elapses after said circuit means begins generating said control signal.

17. A shock absorber system as in claim 14, wherein said charging and discharging means comprises switching circuit means for charging said piezo-actuator, in accordance with said control signal provided by said control circuit means, by electrically coupling a first terminal of said high-voltage generating means to said piezo-actuator, and for discharging said piezo-actuator by electrically coupling a second terminal of said high voltage generating means to said piezo-actuator, and said abnormality detection means comprises detection circuit means, coupled to said switching circuit means, for responding to a current generate in said switching circuit means in accordance with said control signal provided by said control circuit means, said detection circuit comparing a level of an alternating-current component of the current generated in said switching circuit with a predetermined reference voltage to detect said abnormality.

18. A shock absorber system as in claim 14, wherein said charging and discharing means comprises circuit means for charging and discharging coupled to said piezo-actuator, said circuit means for charging and discharging generating both the charging current and the discharging current, and said abnormality detection means being coupled to said charging and discharging circuit means to detect both the charging current and the discharing current, in response to the control signal from said control circuit means, to detect said abnormality.

19. A shock absorber system as in claim 5, wherein said high-voltage generating means comprises boosting circuit means for boosting a voltage up to a value of the high voltage, and said inhibiting means stopping said boosting operation by said boosting circuit means.

20. A shock absorber system as in claim 10, wherein said high-voltage generating means comprises boosting circuit means for boosting a voltage up to a value of the high voltage, and said inhibiting means stops said boosting.

21. A shock absorber system as in claim 18, wherein said abnormality detection means comprises means for changing the charging current and discharging current to voltages to detect said abnormality.

* * * * *